United States Patent
Mitra et al.

(10) Patent No.: US 10,274,822 B2
(45) Date of Patent: Apr. 30, 2019

(54) TEMPLATE AND METHOD OF MANUFACTURING SEMICONDUCTOR DEVICE

(71) Applicant: Toshiba Memory Corporation, Tokyo (JP)

(72) Inventors: Anupam Mitra, Yokohama Kanagawa (JP); Motofumi Komori, Yokohama Kanagawa (JP); Kazuhiro Takahata, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/694,585

(22) Filed: Sep. 1, 2017

(65) Prior Publication Data

US 2018/0164680 A1 Jun. 14, 2018

(30) Foreign Application Priority Data

Dec. 8, 2016 (JP) .................................. 2016-238862

(51) Int. Cl.
*G03F 1/50* (2012.01)
*G03F 7/00* (2006.01)
*B29C 33/38* (2006.01)
*H01L 21/311* (2006.01)

(52) U.S. Cl.
CPC ............ *G03F 7/0002* (2013.01); *B29C 33/38* (2013.01); *G03F 1/50* (2013.01); *G03F 7/00* (2013.01); *H01L 21/31144* (2013.01); *H01L 21/31116* (2013.01)

(58) Field of Classification Search
CPC ............ H01L 21/311; H01L 21/31144; H01L 21/027; H01L 33/38
See application file for complete search history.

(56) References Cited

U.S. PATENT DOCUMENTS

| | | | |
|---|---|---|---|
| 2008/0090170 A1 | 4/2008 | Yoneda | |
| 2012/0085887 A1* | 4/2012 | Kaneko | .................. B29C 33/40 249/114.1 |
| 2012/0138985 A1* | 6/2012 | Ono | .................... H01L 21/0243 257/98 |

FOREIGN PATENT DOCUMENTS

| | | |
|---|---|---|
| JP | 2008091782 A | 4/2008 |
| JP | 5119579 B2 | 1/2013 |
| JP | 5982947 B2 | 8/2016 |

* cited by examiner

*Primary Examiner* — Jaehwan Oh
*Assistant Examiner* — John M Parker
(74) *Attorney, Agent, or Firm* — Kim & Stewart LLP (57) ABSTRACT

A template for patterning processes has a first protrusion portion on a first surface with a first step portion in a first region and a second step portion in a second region. The first step portion includes a plurality of first steps, at least one of which has a first step height and a first step width. The second step portion includes a plurality of second steps, at least one of which has the first step height and the first step width. The template includes a first recess portion on the first surface between the first and second regions on the first protrusion portion. The first recess portion has at least one of a recess depth different from the first step height and a recess width different from the first step width.

19 Claims, 12 Drawing Sheets

TEMPLATE AND METHOD OF MANUFACTURING SEMICONDUCTOR DEVICE

CROSS-REFERENCE TO RELATED APPLICATION

This application is based upon and claims the benefit of priority from Japanese Patent Application No. 2016-238862, filed Dec. 8, 2016, the entire contents of which are incorporated herein by reference.

FIELD

Embodiments described herein relate generally to a template and a method of manufacturing a semiconductor device.

BACKGROUND

There are patterning methods using templates for forming patterns on substrates. There are methods of manufacturing semiconductor devices using the films patterned using these templates. It is preferable for these templates to have good formability.

DETAILED DESCRIPTION

In general, according to one embodiment, a template for patterning processes, such as, for example, imprint or nanoimprint lithography, includes: a first protrusion portion on a first surface and having a first step portion in a first region and a second step portion in a second region, the first step portion including a plurality of first steps, at least one first step having a first step height and a first step width, the second step portion including a plurality of second steps, at least on second step having the first step height and the first step width; and a first recess portion on the first surface between the first and second regions on the first protrusion portion, the first recess portion having at least one of a recess depth different from the first step height and a recess width different from the first step width.

Hereinafter, example embodiments of the present disclosure will be described with reference to the drawings.

The drawings are schematic and conceptual. Relations between thicknesses and widths of components or portions, ratios of sizes between the components or portions, and the like may not necessarily be the same as the actual relations, ratios, and the like. When the same components or portions are illustrated in different drawing, dimensions and ratios of these components or portions may be different depending on the drawings in some cases.

In the present specification and the drawings, the same reference numerals are given to the same elements as those described in previous drawings and the detailed description thereof may be appropriately omitted.

First Embodiment

Figure 1A:
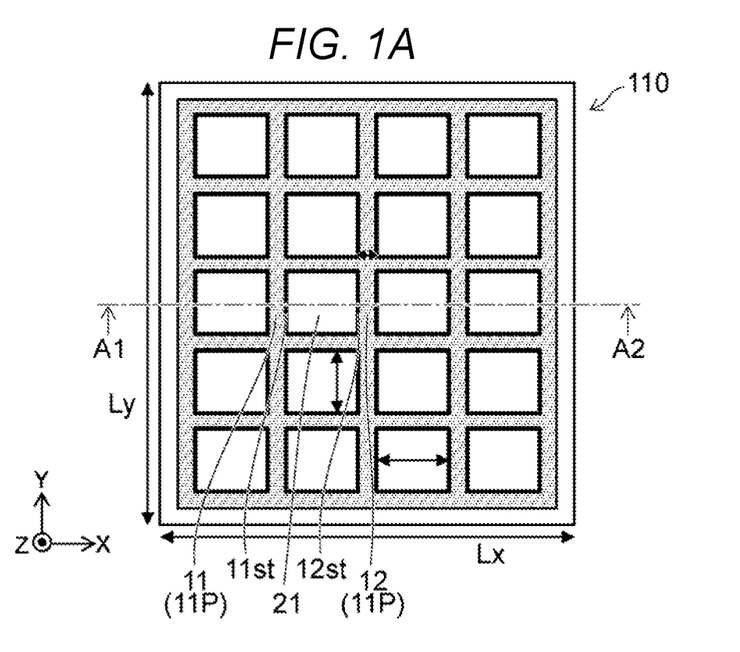
FIGS. 1A to 1C are schematic diagrams depicting a template according to a first embodiment.
Figure 1B:
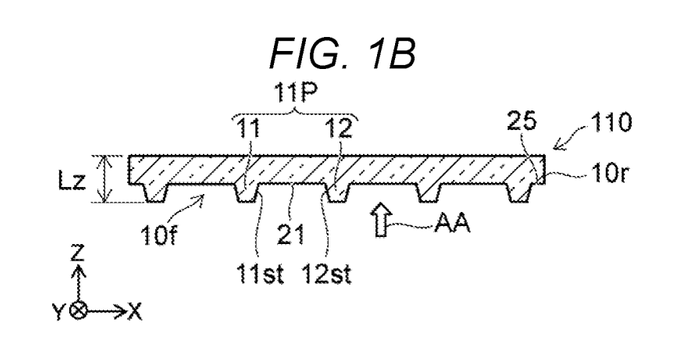
Figure 1C:
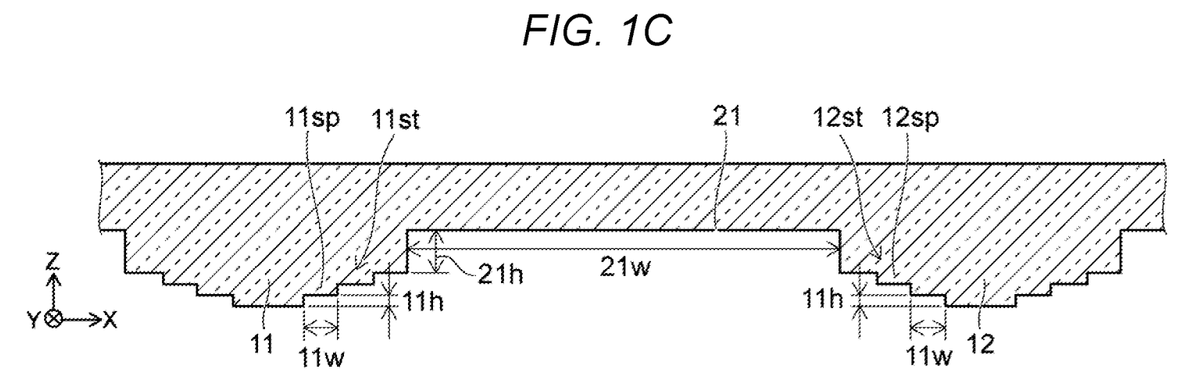

FIGS. 1A to 1C are schematic diagrams of a template according to a first embodiment.

FIG. 1A is a plan view when viewed from an arrow AA of FIG. 1B. FIG. 1B is a cross-sectional view taken along the line A1-A2 of FIG. 1A. FIG. 1C is an enlarged cross-sectional view illustrating a part of FIG. 1B.

As illustrated in FIGS. 1A to 1C, a template 110 has a first surface 10f. The template 110 includes a first protrusion portion 11P and a first recess portion 21. The first protrusion portion 11P and the first recess portion 21 are provided on the first surface 10f.

A direction substantially orthogonal to the first surface 10f is assumed to be a Z axis direction. One direction perpendicular to the Z axis direction is assumed to be an X axis direction. A direction perpendicular to the Z axis direction and the X axis direction is assumed to be a Y axis direction. The template 110 has a plate shape extending substantially along an X-Y plane.

The first protrusion portion 11P includes a plurality of regions (for example, a first region 11 and a second region 12). In this example, the first protrusion portion 11P is formed in a lattice shape (see FIG. 1A). Portions of the first protrusion portion 11P extend in the X axis direction. Other portions of the first protrusion portion 11P extend in the Y axis direction.

For example, when the template 110 is cut at one position to reveal a Z-X planar cross-section (see FIG. 1B), the portions of the first protrusion portion 11P are spaced from each other in the X axis direction. One of these portions of the first protrusion portion 11P is the first region 11. Another of these portions of the first protrusion portion 11P is the second region 12.

As illustrated in FIG. 1C, a side surface of the portions of the first protrusion portion 11P has a step shape.

For example, the first region 11 includes a first step portion list. The first step portion list includes a plurality of first steps lisp. Here, each of the first steps lisp is depicted as having a first step height 11h and a first step width 11w, though the first steps lisp may each have different step heights and step widths so long as at least one first step lisp has the first step height 11h and the first step width 11w. The first step height 11h is a height of at least one first step lisp in the Z axis direction. As depicted in FIG. 1C, the first step width 11w is a width of a first step lisp in the X axis direction. The direction of the width intersects the direction of the height.

The second region 12 includes a second step portion 12st. The second step portion 12st includes a plurality of second steps 12sp. Here, each of the second steps 12sp also has the first step height 11h and the first step width 11w. As depicted in FIG. 1C, the second region 12 faces the first region 11 in the direction of the width.

In this way, each of the portions of protrusion 11P provided on the first surface 10f includes a step portion. In this example, the step portions all have the same step height and the same step width, but this is not necessarily required. A pattern is then formed by imprinting lithography using the template 110. At this time, the shape of the step portion is transferred to an imprintable material, such as a resin liquid film or resin precursor material. This imprintable material may also be referred as a receiver material.

The first recess portion 21 is between the first region 11 and the second region 12 on the first surface 10f. As illustrated in FIG. 1B, a plurality of recess portions can be provided on the first surface 10f. One of these plurality of recess portions is the first recess portion 21.

As illustrated in FIG. 1A, each of the recess portions has an island shape, that is, the first protrusion portion 11P is provided surrounding each of the recess portions.

As illustrated in FIG. 1C, the first recess portion 21 has a first recess portion depth 21h and a first recess portion width 21w. The first recess portion depth 21h is a height in the Z axis direction. The first recess portion width 21w is a width of the first recess portion 21 in the X axis direction. In this example, the first recess portion depth 21h is different from the first step height 11h. Also, the first recess portion width 21w is different from the first step width 11w in this example.

In this way, the first recess portion 21 has at least one of a first recess portion depth 21h that is different from the first step height 11h or a first recess portion width 21w that is different from the first step width 11w. Thus, the first recess portion 21 has a different shape from the step portions.

A pattern is formed by imprinting using the template 110. In this process, a bubble can be formed in the first recess portion 21. For example, as described above, the template 110 has a pattern to be transferred. On the other hand, when a gas is between the template 110 and the receiver material during the imprinting (e.g., a resin liquid film), a bubble can be formed or stored in the first recess portion 21. The gas contains, for example, air. The gas may include nitrogen, helium, or the like. In the example, a bubble is prevented from being formed in the step portion. Thus, a desired pattern shape can be obtained using the step portion for transferring the pattern shape. Here, the first recess portion 21 functions as a place in which a bubble which would otherwise cause abnormality in the pattern shape can be stored.

According to the example, it is possible to prevent abnormality in the pattern shape from occurring due to a bubble. By using the template according to the embodiment, it is possible to provide a method of manufacturing a semiconductor device with a good pattern.

In this example, the first recess portion depth 21h is greater than the first step height 11h. The first recess portion width 21w is also greater than the first step width 11w. Thus, a bubble is stored stably in the first recess portion 21. After the bubble is in the first recess portion 21, a resin layer can still be provided inside the first recess portion 21 with sufficient thickness. Thus, the pattern shape can be further stabilized.

Further, as illustrated in FIG. 1B, an outer edge recess portion 25 is provided along an outer edge 10r of the template 110. For example, in a process of forming the pattern by imprinting using the template 110, the receiver material (e.g., the resin liquid film) is extruded to the outer edge 10r of the template 110 in some cases. It was found that a pattern failure occurs due to the extruded receiver material in some cases. In the example, by providing the outer edge recess portion 25 along the outer edge 10r, the extruded receiver material can be stored in the outer edge recess portion 25. For example, it is possible to prevent the extruded receiver material from being widely spread beyond the template 110.

According to the example, it is thus possible to prevent the extruded receiver material from being spread beyond the template 110. Thus, it is possible to provide a template with good formability. By using the template according to the example, it is possible to provide a method of manufacturing a semiconductor device with a good pattern.

A length Lx (see FIG. 1A) of the template 110 in the X axis direction is, for example, equal to or greater than 10 mm and equal to or less than 80 mm. A length Ly (see FIG. 1A) of the template 110 in the Y axis direction is, for example, equal to or greater than 10 mm and equal to or less than 80 mm. A thickness of the template 110 (which is the length Lz in the Z axis direction, see FIG. 1B) is, for example, equal to or greater than 0.05 mm and equal to or less than 10 mm. These values are examples values.

A length (e.g., the first recess portion width 21w) of one of the recess portions (for example, the first recess portion 21) in the X axis direction is, for example, equal to or greater than 0.05 mm and equal to or less than 10 mm. The length of the first recess portion 21 in the Y axis direction is, for example, equal to or greater than 0.05 mm and equal to or less than 10 mm. The first recess portion depth 21h is, for example, equal to or greater than 10 nm and equal to or less than 40000 nm.

The first step height 11h is, for example, equal to or greater than 10 nm and equal to or less than 500 nm. The first step width 11w is, for example, equal to or greater than 10 nm and equal to or less than 2000 nm.

For example, quartz is used in the template 110. The template 110 is, for example, transparent. In the template 110, light transmittance is high in a relevant wavelength.

Hereinafter, an example of a method of manufacturing a semiconductor device using template 110 will be described. FIGS. 2A to 3B are schematic cross-sectional views of the method of manufacturing the semiconductor device using the template 110. In the drawings to be described below, some of the steps in the plurality of steps are not illustrated in some cases to highlight certain aspects of the embodiment.

In this example, the shape of the template 110 is transferred to a stacked body 40.

Figure 2A:
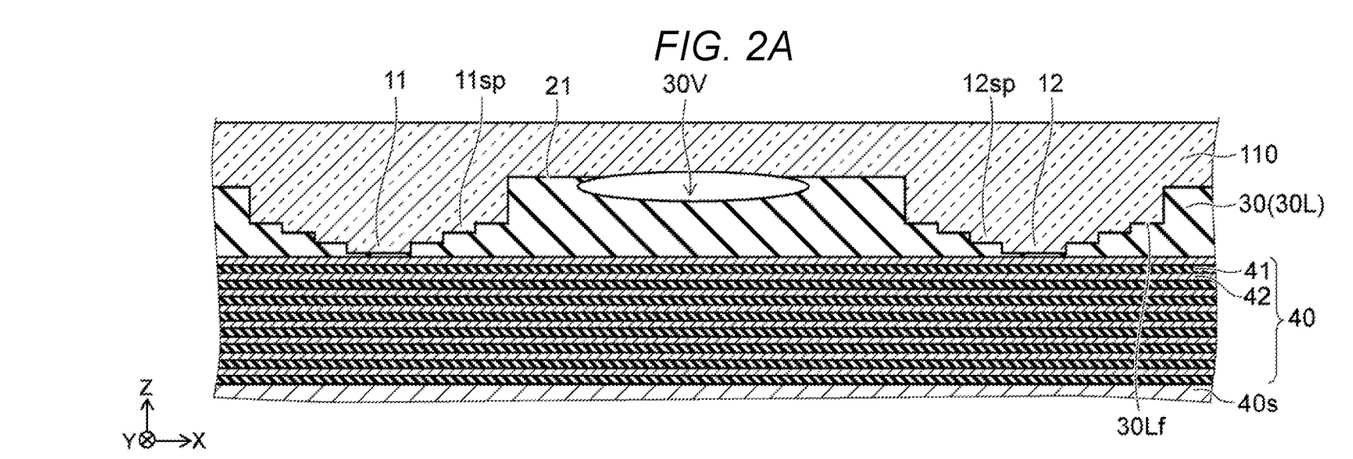
FIGS. 2A and 2B are schematic cross-sectional views depicting aspects of a method of manufacturing a semiconductor device using a template according to the first embodiment.

As illustrated in FIG. 2A, a stacked body 40 is provided on a substrate 40s (for example, a silicon substrate). The stacked body 40 includes a plurality of first layers 41 and a plurality of second layers 42. The first layers 41 and the second layers 42 are alternately provided on the substrate 40s. Each first layer 41 is, for example, a silicon oxide film. Each second layer 42 is a silicon nitride film. In this way, a material of the first layer 41 is different from a material of the second layer 42.

A receiver material 30, also referred to in this example as a resin liquid film 30, is applied on the stacked body 40. Any applying method can be used. In the applying, for example, spin coating or ink jet dispensing is performed. The resin liquid film 30 is, for example, a resist material or resist material precursor.

Thereafter, the first surface 10f of the template 110 is brought into contact with the resin liquid film 30. For example, the first protrusion portion 11P comes into contact with the resin liquid film 30. The first region 11 and the second region 12 are brought into contact with the resin liquid film 30. At this time, at least a part of the first recess portion 21 is still separated from the resin liquid film 30. The separation is achieved by a bubble 30v. In this way, the bubble 30v is stored in the first recess portion 21. Thus, the bubble 30v is not present in other portions. The bubble 30v can be prevented from being formed in the first region 11 and the second region 12 of the step portion.

In this state of contact between template 110 and resin liquid film 30, the resin liquid film 30 is solidified. For example, when the resin liquid film 30 has a photosetting property, light (such as an ultraviolet ray) is radiated onto the resin liquid film 30. When the resin liquid film 30 has a thermosetting property, heating can be performed. Thus, a resin layer 30L can be obtained from the initial resin liquid film 30. The resin layer 30L includes a surface 30Lf facing the template 110. The surface 30Lf has a shape in which the shape of the first protrusion portion 11P (e.g., the first region 11, the second region 12, and the like) is generally reflected.

In this way, the shape of at least a part of the first surface 10f of the template 110 is transferred to the surface 30Lf of the resin layer 30L. For example, the shape of the step portion of the first region 11, the second region 12, and the like is transferred to the resin layer 30L. On the other hand, the complete shape of the first recess portion 21 is not necessarily transferred to the resin layer 30L. This transferred shape of the first recess portion 21 depends in part on the bubble 30v. However, the bubble 30v is collected in the first recess portion 21, and thus the shape of the step portion of the first region 11, the second region 12, and the like can still be satisfactorily transferred to the resin layer 30L.

Figure 2B:
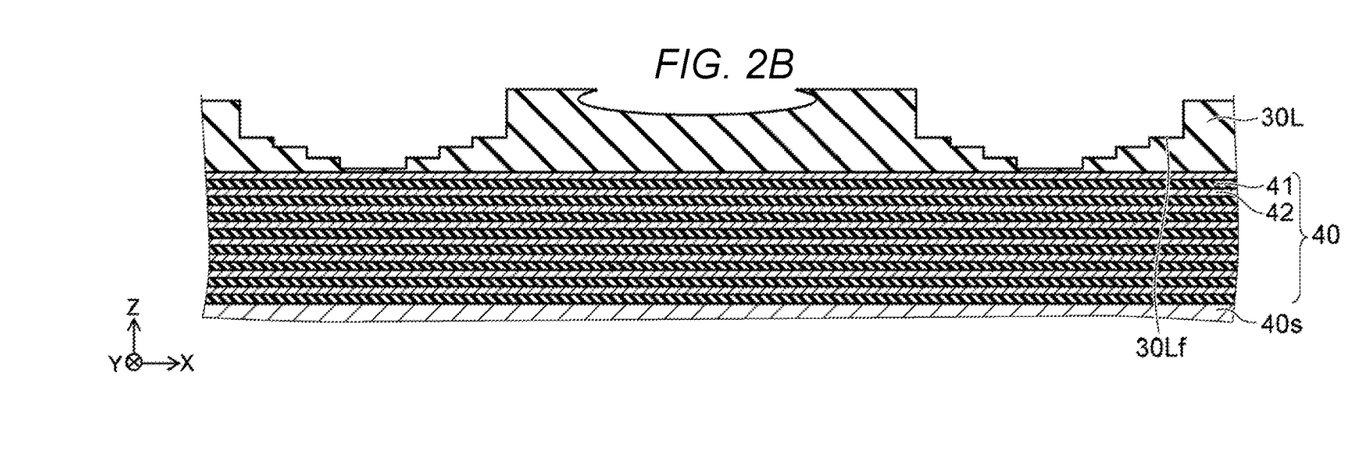

As illustrated in FIG. 2B, the first surface 10f of the template 110 is detached from the resin layer 30L. A recess portion corresponding to the bubble 30v is formed in a portion corresponding to the first recess portion 21. The resin layer 30L with a sufficient thickness can be still be formed between the bottom surface of the recess portion and the upper surface of the stacked body 40. For example, the first recess portion depth 21h is appropriately set to achieve this state.

Figure 3A:
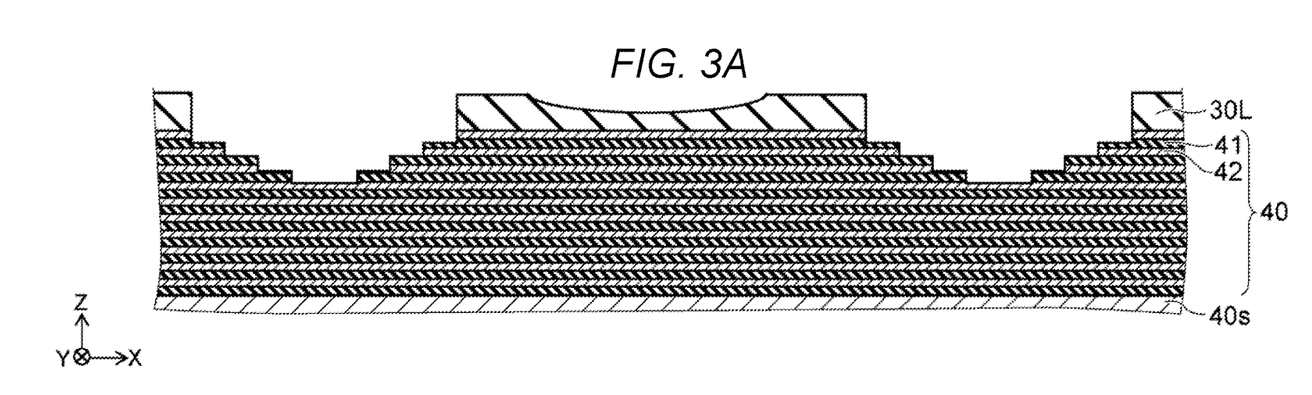
FIGS. 3A and 3B are schematic cross-sectional views depicting aspects of a method of manufacturing a semiconductor device using a template according to the first embodiment.

As illustrated in FIG. 3A, the stacked body 40 is processed using the resin layer 30L as a mask. For example, etching such as reactive ion etching (RIE) is performed. For example, the step shape formed in the resin layer 30L is transferred to the stacked body 40.

Figure 3B:
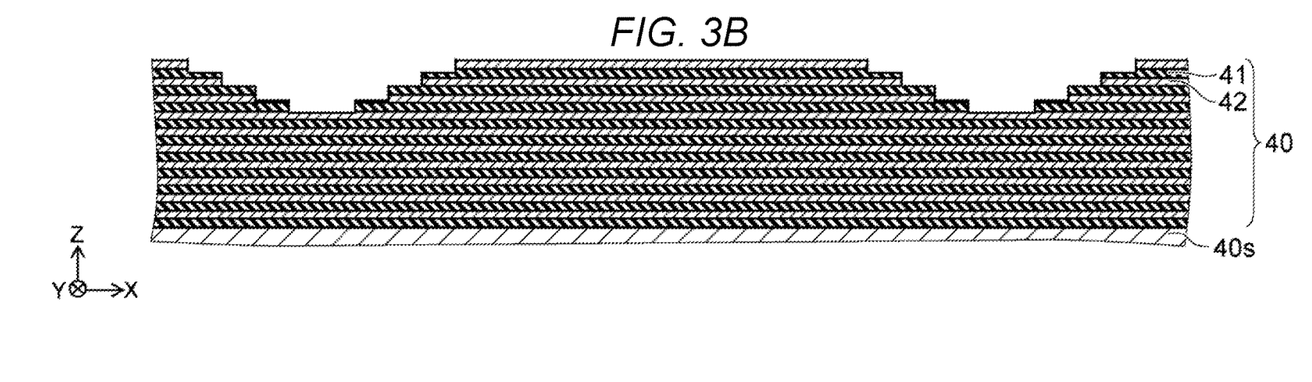

As illustrated in FIG. 3B, the resin layer 30L is removed. Thereafter, for example, a portion serving as a memory cell (not illustrated) can be formed in a region corresponding to the first recess portion 21 in the stacked body 40. One of the first layers 41 and the second layers 42 is removed and the other layer is left. At this time, the left layer may be supported by the portion serving as the memory cell. A conductive material (for example, tungsten) is introduced in a space formed by removing the one layer. A plurality of stacked conductive layers can be formed using the conductive material. Further, for example, in the portion of the step shape, a connection portion (for example, a via electrode) extending in the Z axis direction can be formed contacting each of the plurality of conductive layers. The plurality of conductive layers functions as word lines or the like of a semiconductor storage device (for example, a 3-dimensional memory).

Figure 4:
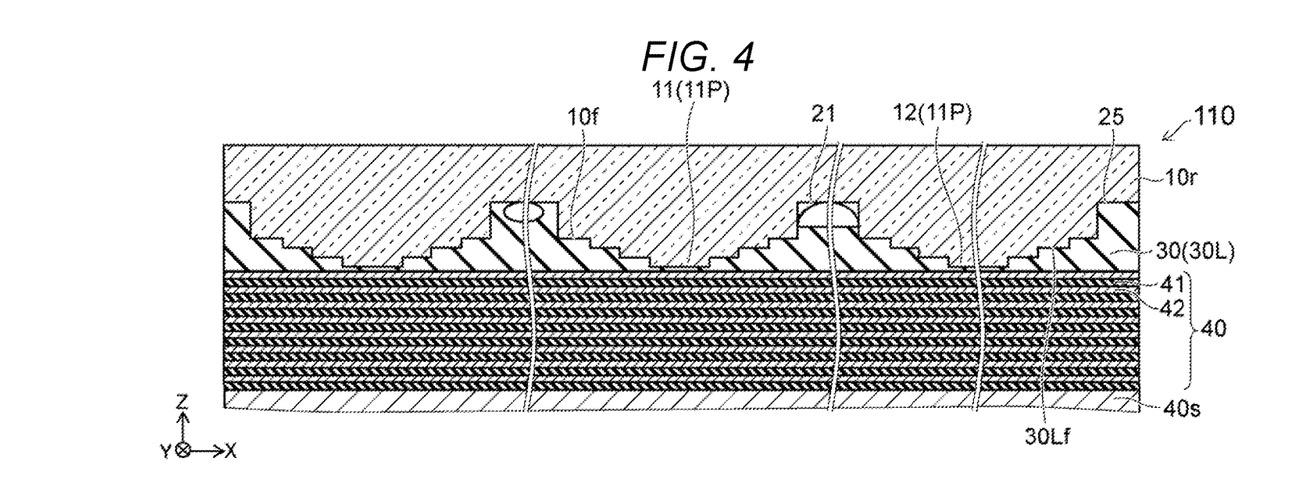
FIG. 4 is a schematic cross-sectional view depicting aspects of a method of manufacturing a semiconductor device using a template according to the first embodiment.

FIG. 4 is a schematic cross-sectional view of a method of manufacturing a semiconductor device using the template 110 according to the first embodiment.

FIG. 4 depicts a processing stage corresponding to FIG. 2A. In FIG. 4, the state of the outer edge 10r of the template 110 is depicted. As illustrated in FIG. 4, the outer edge recess portion 25 is provided along the outer edge 10r of template 110. Therefore, when the resin liquid film 30 comes into contact with the first region 11, the second region 12, and the like of the first protrusion portion 11P, the resin liquid film 30 enters the outer edge recess portion 25. Therefore, the extruded imprintable material (e.g., the resin liquid film 30) can be prevented from being spread substantially beyond than the template 110.

Figure 5:
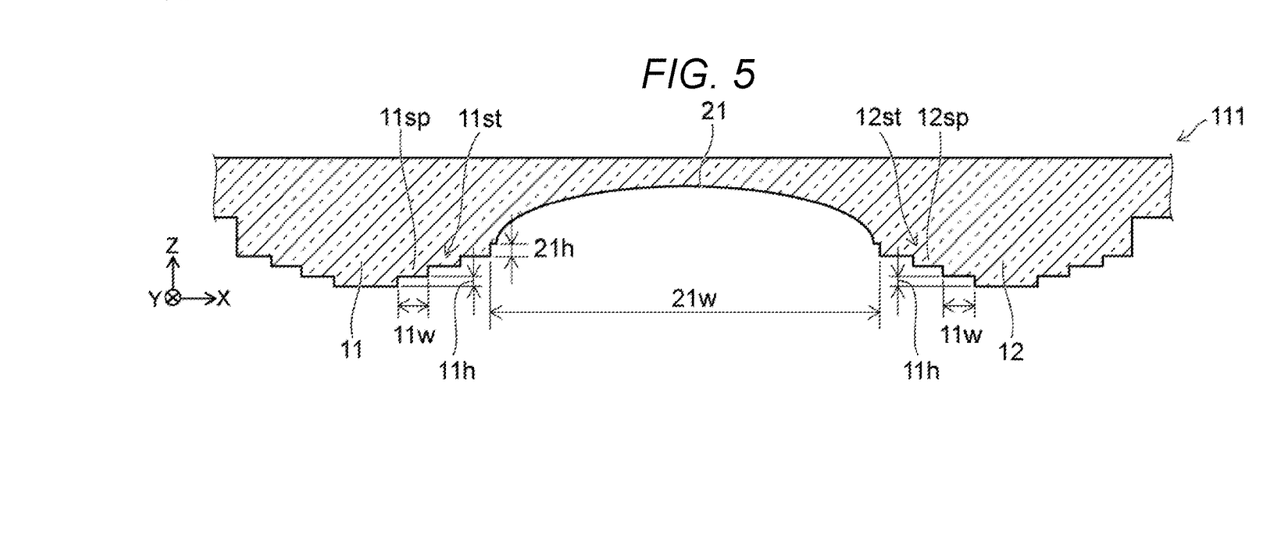
FIG. 5 is a schematic cross-sectional view depicting another template according to the first embodiment.

FIG. 5 is a schematic cross-sectional view of another template (template 111) according to the first embodiment.

As illustrated in FIG. 5, the first protrusion portion 11P and the first recess portion 21 are also formed in template 111. However, in this example, the first recess portion 21 of template 111 includes a curved surface.

Figure 6:
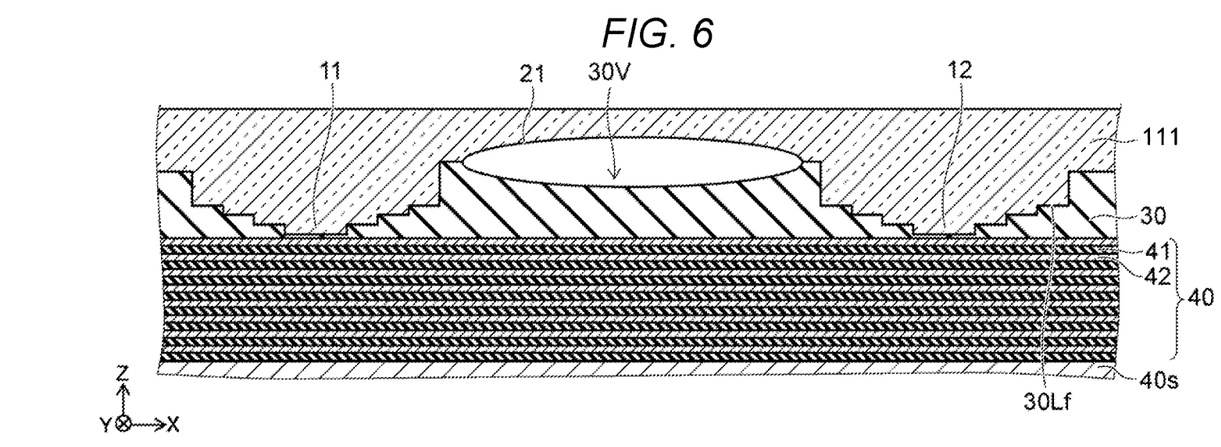
FIG. 6 is a schematic cross-sectional view depicting aspects of a method of manufacturing a semiconductor device using the template depicted in FIG. 5.

FIG. 6 is a schematic cross-sectional view exemplifying a method of manufacturing a semiconductor device using the template according to the first embodiment.

FIG. 6 depicts a process stage corresponding to FIG. 2A. As illustrated in FIG. 6, the first region 11 and the second region 12 of the template 111 comes into contact with the resin liquid film 30. When the bubble 30v is formed between the template 111 and the resin liquid film 30, the bubble 30v is collected in the first recess portion 21. In the step portion, the bubble 30v is not formed. In this way, when the first region 11 and the second region 12 of template 111 are brought into contact with the resin liquid film 30, at least a part of the first recess portion 21 and the resin liquid film 30 are in a separated state. In this contact state, the resin liquid film 30 is solidified. In regard to the template 111, it is also possible to provide the template having good formability and the method of manufacturing the semiconductor device.

Figure 7:
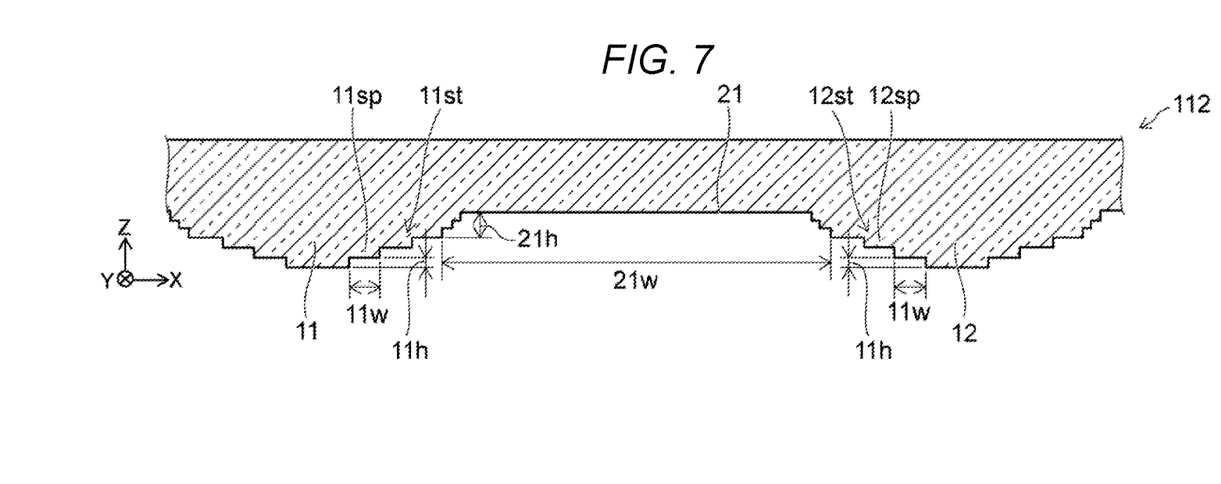
FIG. 7 is a schematic cross-sectional view depicting still another template according to the first embodiment.

FIG. 7 is a schematic cross-sectional view depicting another template (template 112) according to the first embodiment.

As illustrated in FIG. 7, the first protrusion portion 11P and the first recess portion 21 are also provided in a template 112. However, in this example, a plurality of small steps are provided on an outer edge of the first recess portion 21. The first recess portion 21 still has a first recess portion depth 21h different from the first step height 11h in template 112. The first recess portion 21 still has a first recess portion width 21w different from the first step width 11w in template 112. However, in template 112, a step portion, different from the first step portion list and the second step portion 12st, is provided.

Figure 8:
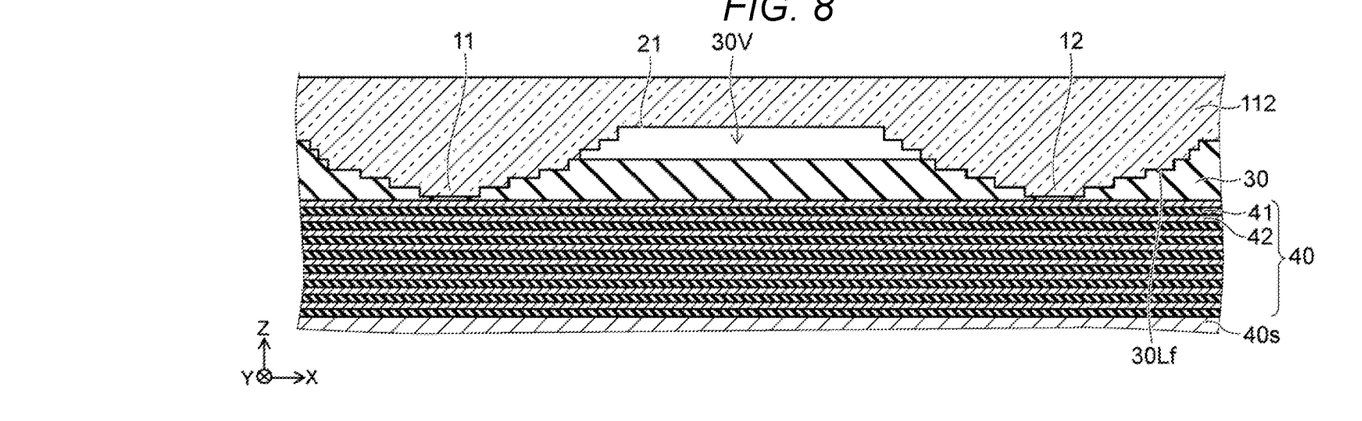
FIG. 8 is a schematic cross-sectional view depicting aspects of a method of manufacturing a semiconductor device using the template illustrated in FIG. 7.

FIG. 8 is a schematic cross-sectional view depicting a method of manufacturing a semiconductor device using template 112 according to the first embodiment.

FIG. 8 depicts a process stage corresponding to FIG. 2A. As illustrated in FIG. 8, the first region 11 and the second region 12 of the template 112 come into contact with the resin liquid film 30. When the bubble 30v is formed between the template 112 and the resin liquid film 30, the bubble 30v is collected in the first recess portion 21. In the step portion, the bubble 30v is not formed.

Figure 9:
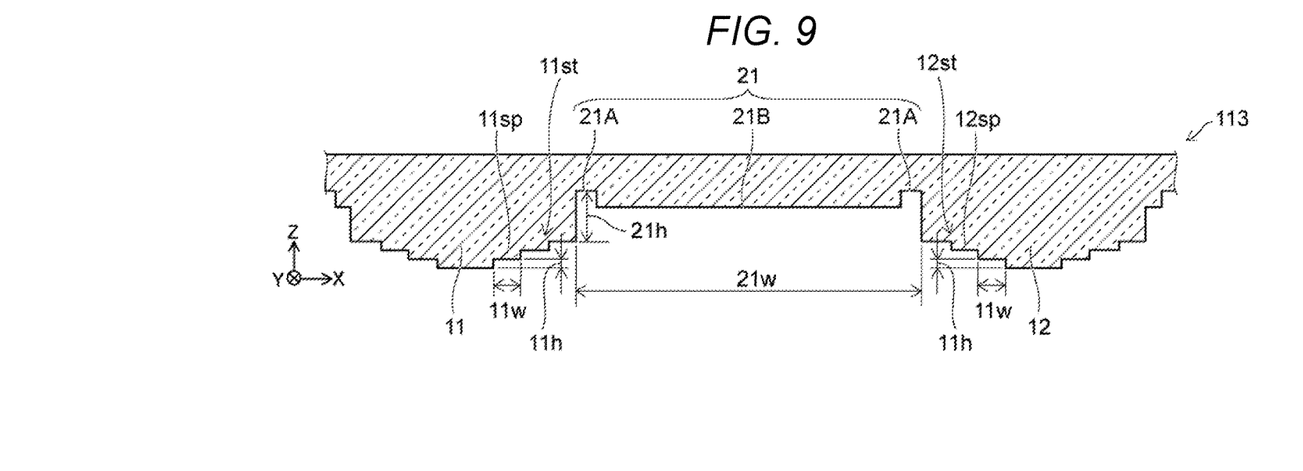
FIG. 9 is a schematic cross-sectional view depicting still further another template according to the first embodiment.

FIG. 9 is a schematic cross-sectional view depicting another template (template 113) according to the first embodiment.

As illustrated in FIG. 9, the first protrusion portion 11P and the first recess portion 21 are also provided on the first surface 10f in a template 113. However, in template 113, the first recess portion 21 includes a bottom region 21A and an intermediate region 21B. The bottom region 21A is provided between the first region 11 and the intermediate region 21B and between the second region 12 and the intermediate region 21B. The depth of the bottom region 21A when the first protrusion portion 11P is used as a reference is deeper than the depth of the intermediate region 21B when the first protrusion portion 11P is used as the reference. For example, the bottom region 21A may continue so as to surround the periphery of the intermediate region 21B. The bottom region 21A may also be divided into a plurality of portions by the intermediate region 21B.

Figure 10:
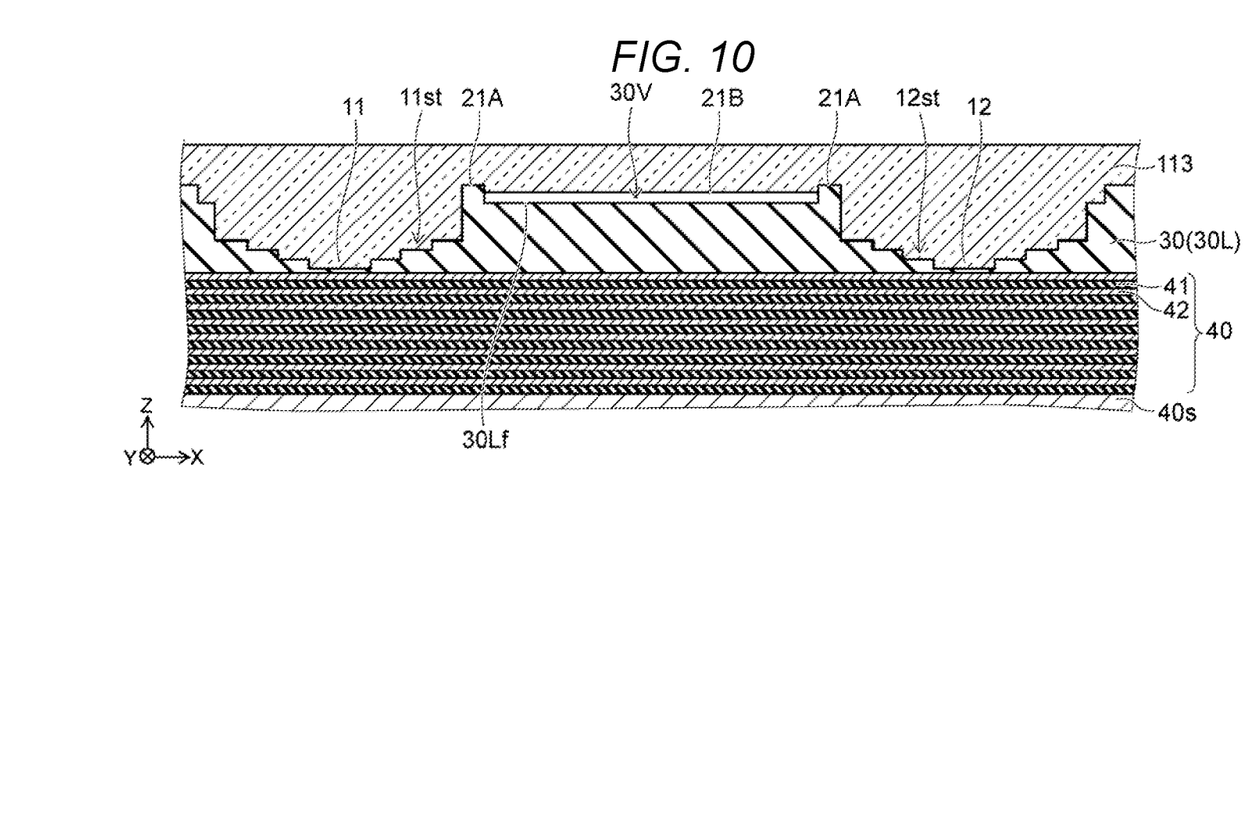
FIG. 10 is a schematic cross-sectional view depicting aspects of a method of manufacturing a semiconductor device using the template illustrated in FIG. 9.

FIG. 10 is a schematic cross-sectional view depicting a method of manufacturing a semiconductor device using template 113 according to the first embodiment.

FIG. 10 depicts a process stage corresponding to FIG. 2A. As illustrated in FIG. 10, the first region 11 and the second region 12 of the template 113 comes into contact with the resin liquid film 30. When the bubble 30v is formed between the template 113 and the resin liquid film 30, the bubble 30v is collected in the first recess portion 21. For example, the resin liquid film 30 coming into contact with the step portion enters inside the bottom region 21A. For example, the bubble 30v is collected between the intermediate region 21B and the resin liquid film 30. In the step portion, the bubble 30v is not formed. In this way, in template 113, when the first region 11 and the second region 12 are brought into contact with the resin liquid film 30, at least a part of the first recess portion 21 and the resin liquid film 30 are in a separated state. In this contact state, the resin liquid film 30 is solidified to obtain a resin layer 30L. The template 113 is then detached from the resin layer 30L.

When template 113 is used, a portion with a recess shape corresponding to the bubble 30v is formed on the surface 30Lf of the resin layer 30L. A region with a protrusion shape corresponding to the bottom region 21A is formed around the portion with the recess portion.

In some instances, the thickness of the resin layer 30L between the bottom surface of the portion with the recess shape and the stacked body 40 can be too thin. In such instances, another resin liquid (e.g., resist) may be partially applied later to the portion with the recess shape. Thus, the later applied resin liquid p can be used to fill the region within the protrusion shape corresponding to the bottom region 21A. It thus is possible to prevent the later applied resin liquid from spreading to the step portions.

Figure 11A:
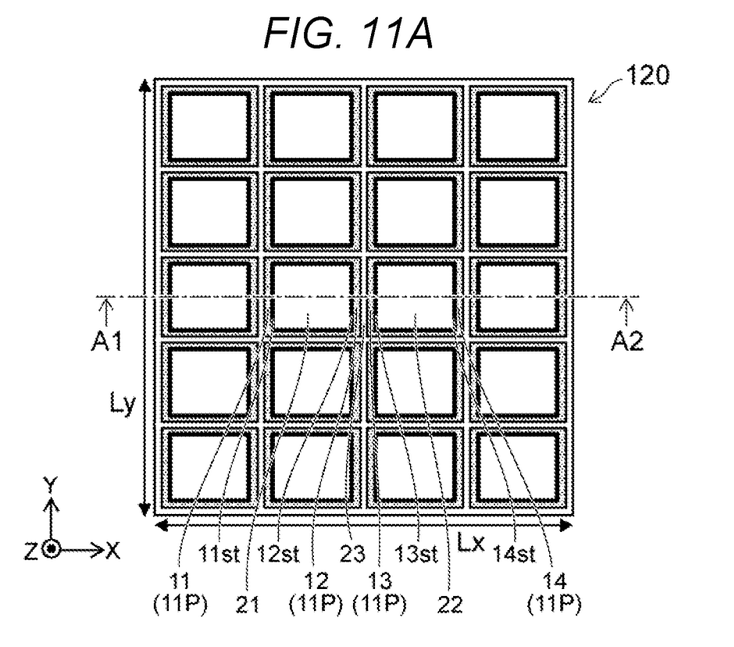
FIGS. 11A to 11C are schematic views depicting yet another template according to the first embodiment.
Figure 11B:
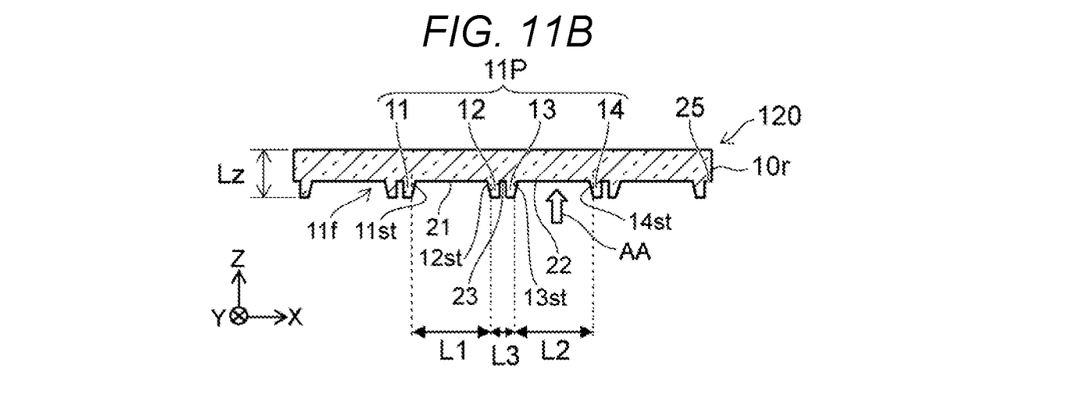
Figure 11C:
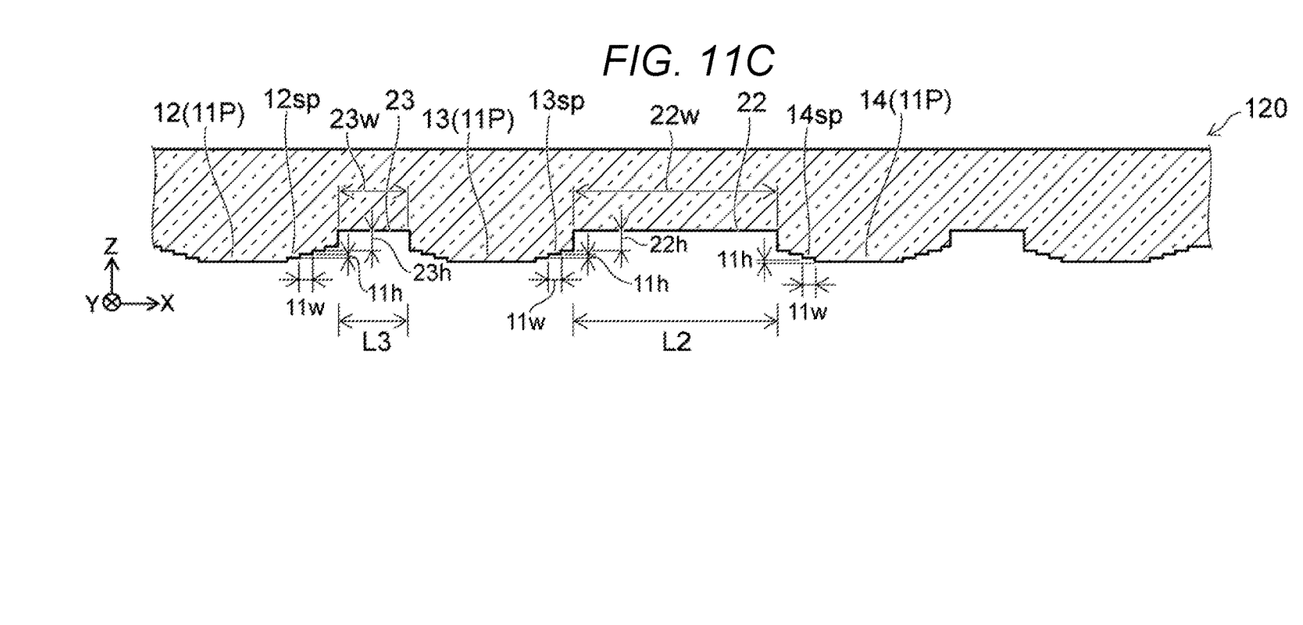

FIGS. 11A to 11C are schematic views depicting another template (template 120) according to the first embodiment.

FIG. 11A is a plan view when viewed from an arrow AA of FIG. 11B. FIG. 11B is a cross-sectional view taken along the line A1-A2 of FIG. 11A. FIG. 11C is an enlarged cross-sectional view illustrating a part of FIG. 11B.

As illustrated in the drawings, a template 120 further includes a second recess portion 22 and a third recess portion 23 in addition to the first protrusion portion 11P and the first recess portion 21. The first protrusion portion 11P further includes a third region 13 and a fourth region 14.

Here, the second region 12 is between the first region 11 and the fourth region 14. The third region 13 is between the second region 12 and the fourth region 14.

The third region 13 is also provided on the first surface 10f. The third region 13 includes a third step portion 13st. The third step portion 13st includes a plurality of third steps 13sp. Each third step 13sp has the first step height 11h and the first step width 11w.

The fourth region 14 is also provided on the first surface 10f. The fourth region 14 includes a fourth step portion 14st. The fourth step portion 14st includes a plurality of fourth steps 14sp. Each fourth step 14sp has the first step height 11h and the first step width 11w.

The second recess portion 22 is provided between the third region 13 and the fourth region 14 on the first surface 10f. The second recess portion 22 has at least one of a second recess portion depth 22h that is different from the first step height 11h or a second recess portion width 22w that is different from the first step width 11w.

The third recess portion 23 is provided between the second region 12 and the third region 13 on the first surface 10f. The third recess portion 23 includes a third recess portion depth 23h and a third recess portion width 23w. In this example, the third recess portion depth 23h is different from the first step height 11h. Also, the third recess portion width 23w is different from the first step width 11w.

A distance L1 between the first region 11 and the second region 12 is longer than a distance L3 between the second region 12 and the third region 13. A distance L2 between the third region 13 and the fourth region 14 is longer than the distance L3 between the second region 12 and the third region 13.

The first recess portion 21 corresponds to, for example, one functional unit (for example, a memory unit). The second recess portion 22 corresponds to, for example, another functional unit (for example, a memory unit). The first region 11 and the second region 12 correspond to, for example, a wiring connection region of one functional unit. The third region 13 and the fourth region 14 correspond to, for example, a wiring connection region of another functional unit. The third recess portion 23 is, for example, a pattern segmenting the two functional units. A pattern transferred by using the third recess portion 23 corresponds to a dicing line pattern for dividing a chip, for example. The third recess portion 23 corresponds to, for example, a half unit of two functional units. For example, the half unit can be segmented, thereby segmenting the two functional units.

In this example, a step portion (the second step portion 12st and a slope portion) is also provided on the side of the third recess portion 23 of the second region 12. A step portion (the third step portion 13st and a slope portion) is also provided on the side of the third recess portion 23 of the third region 13. By forming the slope portions, for example, it can be easier to detach the template 120 from the resin layer 30L.

In this example, the third recess portion 23 may have at least one of the third recess portion depth 23h that is different from the first step height 11h and the third recess portion width 23w that is different from the first step width 11w.

Figure 12:
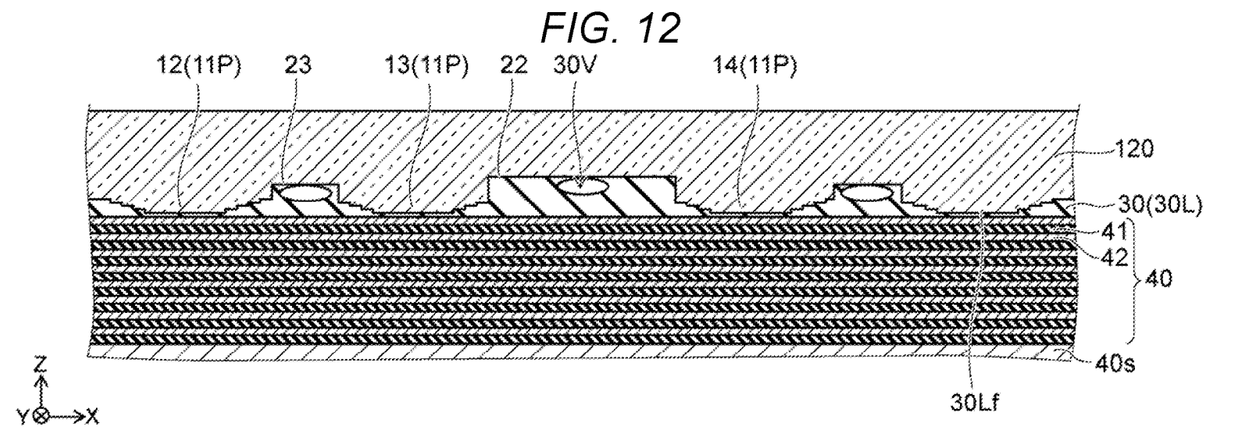
FIG. 12 is a schematic cross-sectional view depicting aspects of a method of manufacturing a semiconductor device using the template illustrated in FIGS. 11A to 11C.

FIG. 12 is a schematic cross-sectional view depicting a method of manufacturing a semiconductor device using template 120 according to the first embodiment.

FIG. 12 depicts a process stage corresponding to FIG. 2A. As illustrated in FIG. 12, the first region 11 and the second region 12 of the template 120 come into contact with the resin liquid film 30. When the bubble 30v is formed between the template 120 and the resin liquid film 30, the bubble 30v is collected in the first recess portion 21, the second recess portion 22, and the third recess portion 23. In the step portions, the bubble 30v is not formed.

Figure 13:
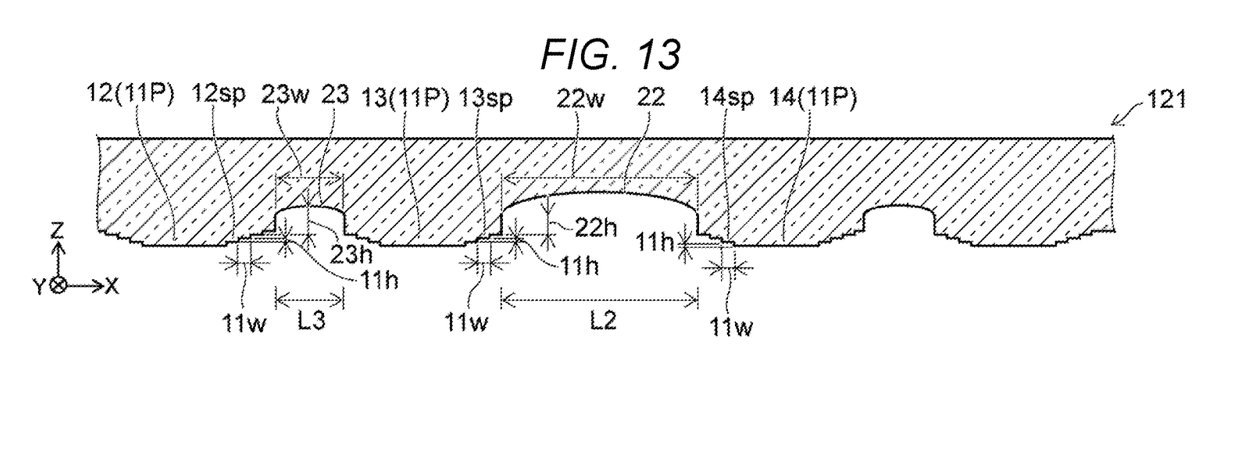
FIG. 13 is a schematic cross-sectional view depicting yet still further another template according to the first embodiment.

FIG. 13 is a schematic cross-sectional view depicting another template (template 121) according to the first embodiment.

In template 121, depicted FIG. 13, the first recess portion 21 is omitted from the depiction. However, the shape of the first recess portion 21 in template 121 is the same as the shape of the second recess portion 22 in template 121. As illustrated in FIG. 13, each of the recess portions (the first recess portion 21, the second recess portion 22, and the third recess portion 23) include curved surfaces.

In this example, the depth of the third recess portion 23 is deeper than the depth of the second recess portion 22 (and also the first recess portion 21).

Figure 14:
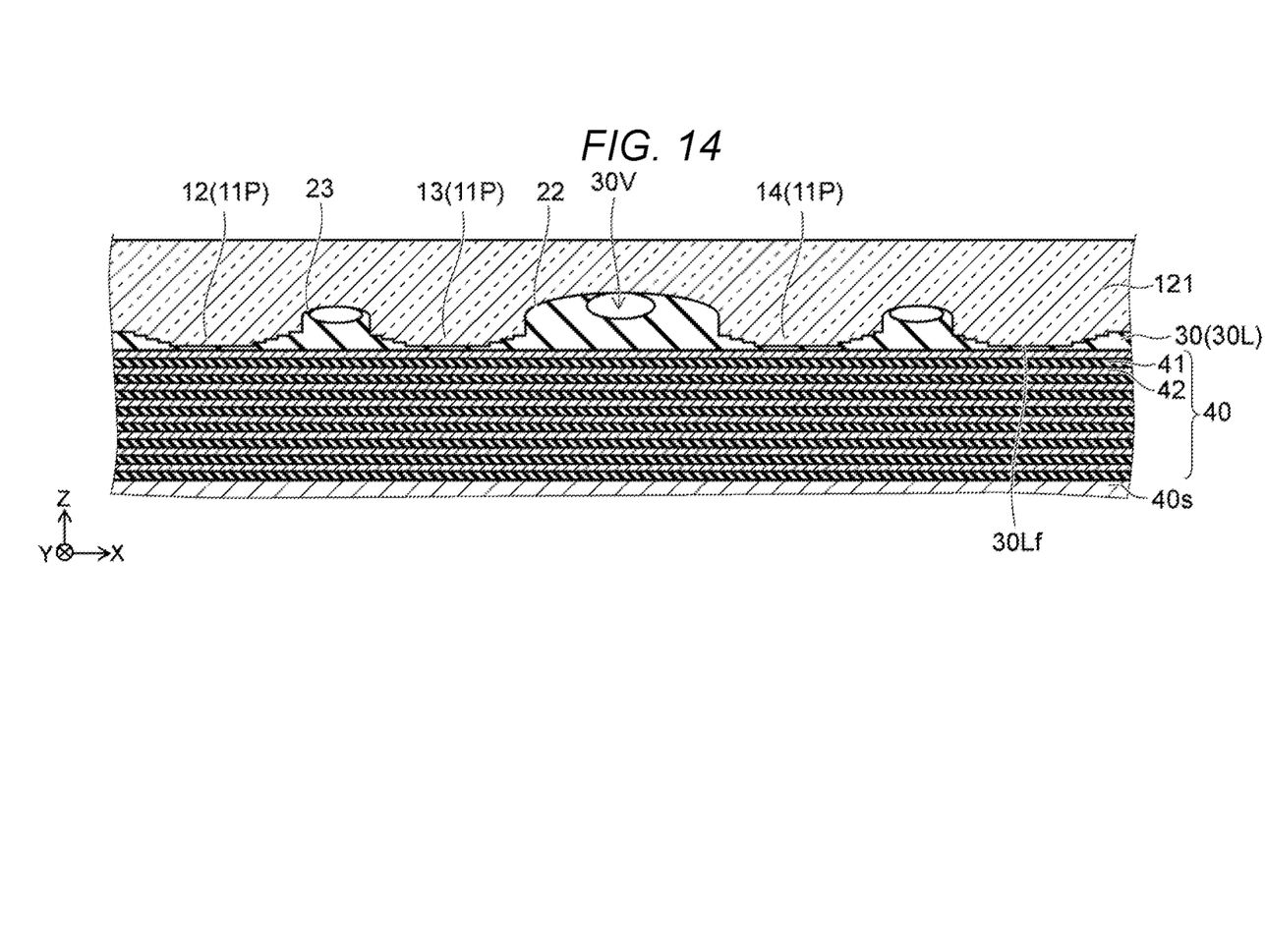
FIG. 14 is a schematic cross-sectional view exemplifying a method of manufacturing a semiconductor device using a template illustrated in FIG. 13.

FIG. 14 is a schematic cross-sectional view depicting a method of manufacturing a semiconductor device using template 121 according to the first embodiment.

FIG. 14 depicts a process stage corresponding to FIG. 2A. As illustrated in FIG. 14, the first region 11 and the second region 12 of a template 121 come into contact with the resin liquid film 30. When bubbles 30v are formed between the template 121 and the resin liquid film 30, the bubbles 30v are collected in the recess portions (e.g., first recess portion 21, the second recess portion 22, and the third recess portion 23). In the step portions, the bubbles 30v do not form.

Second Embodiment

The second embodiment relates to a pattern forming method. The pattern forming method may be included in a method of manufacturing a semiconductor device.

In this method, for example, a resin liquid film 30 is formed on a stacked portion 40 including a plurality of first layers 41 and a plurality of second layers 42 that are alternately provided on a substrate 40s. For example, the process described with reference to FIG. 2A is performed.

In this method, a resin layer 30L is formed by bringing the first region 11 and the second region 12 on a first surface 10f of a template (for example, the template 110) according to the first embodiment into contact with the resin liquid film 30 and solidifying the resin liquid film 30 in the state in which at least a part of the first recess portion 21 is separated from the resin liquid film 30. The resin layer 30L includes a surface 30Lf corresponding to the shapes of the first region 11 and the second region 12. Thereafter, the first surface 10f is detached from the resin layer 30L. For example, the processes described with reference to FIGS. 2A and 2B are performed.

In this method, the stacked body 40 is processed using the resin layer 30L as a mask. For example, the process described with reference to FIG. 3A is performed.

For example, when imprinting is performed using a template that has a step pattern in a gas environment (for example, an atmospheric environment) or the like, a gas can be trapped in the recess portion of the step template. In such cases, a resist pattern defect occurs due to the gas (bubble). Resist deficiency occurs at the defect site caused due to the bubble. The defect occurs in a processed film due to a resist deficiency in withstanding etching of a subsequent process.

On the other hand, a resist extrusion occurs in at the outer edge of a template in some cases. Thus, a region on the outer periphery of the template may not be used for patterning. The width of the region is, for example, equal to or greater than 1 μm and equal to or less than 1 mm.

In the embodiment, a bubble is trapped in a region different from the step portions by the recess portions at the time of imprinting. Thus, a resist defect can be prevented. In the embodiment, an extrusion is trapped by forming the recess portion (e.g., recess portion 10r) on the outer edge of the template. Thus, extrusion can be prevented from spreading beyond the outer periphery of the template.

The example embodiment can be applied, for example, to form wiring connection portions of a semiconductor storage device (for example, a 3-dimensional memory).

According to the example embodiments, for example, a bubble can be prevented even in an environment for example, an atmospheric environment, other than a vacuum environment. Thus, for example, a higher throughput can be obtained in an imprinting process since imprinting can be performed in a normal-pressure (atmospheric) environment and a manufacturing apparatus becomes simpler.

In the present specification, "perpendicular" and "parallel" are not strictly perpendicular and strictly parallel, include, for example, variations or the like in the manufacturing steps, and may be substantially perpendicular and substantially parallel.

Embodiments of the disclosure have been described above with respect to specific examples. However, the disclosure is not limited to the specific examples. For example, specific configurations of the protrusion portions and the recess portions provided in the template and elements of the substrate, the stacked body, and the layers provided in the semiconductor device can be appropriately selected by those skilled in the art to embody the disclosure, and are included in the scope of the disclosure as long as the same advantages can be obtained.

Combination of two or more elements of specific examples within the technically possible scope is also included in the scope of the disclosure.

In addition, all the templates and the methods of manufacturing the semiconductor device which can be appropriately modified in design by those skilled in the art based on the templates and the methods of manufacturing the semiconductor device as described above in the embodiments of the disclosure also pertain to the scope of the disclosure.

In addition, various modifications and variants can be made by those skilled in the art within the concepts of the disclosure. The various modifications and variants are understood to pertain to the scope of the disclosure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A template for patterning processes, comprising:
a first protrusion portion on a first surface and having a first step portion in a first region and a second step portion in a second region, the first step portion including a plurality of first steps, at least one of first step having a first step height and a first step width, the second step portion including a plurality of second steps, at least one second step having the first step height and the first step width; and a first recess portion on the first surface between the first and second regions on the first protrusion portion, the first recess portion having at least one of a recess depth different from the first step height and a recess width different from the first step width, wherein the first recess portion has a bottom region and an intermediate region, the bottom region being between the first region and the intermediate region along the first surface in a direction from the first region to the second region and between the second region and the intermediate region along the first surface in the direction from the first region to second region, and a depth of the bottom region, when a level of the first protrusion portion is used as a reference point, is greater than a depth of the intermediate region when the level of the first protrusion portion is used as the reference point.

2. The template according to claim 1, wherein the recess depth is greater than the first step height, and the recess width is greater than the first step width.

3. The template according to claim 1, wherein the first recess portion includes a curved surface.

4. The template according to claim 1, further comprising:
a second recess portion and a third recess portion, wherein the first protrusion portion further includes a third region and a fourth region, the second region being between the first and fourth regions, the third region being between the second and fourth regions, the third region includes a third step portion including a plurality of third steps, at least one third step having the first step height and the first step width, the fourth region includes a fourth step portion including a plurality of fourth steps, at least one fourth step having the first step height and the first step width, the second recess portion is between the third and fourth regions on the first surface and at least one of a second recess depth different from the first step height and a second recess width different from the first step width, the third recess portion is between the second and third regions on the first surface, and a distance between the first and second regions is longer than a distance between the second and third regions.

5. A method of patterning a substrate, comprising:
imprinting a resin material using a template according to claim 1.

6. A template for imprint lithography, comprising:
a first protrusion portion on a first surface and having a stepped region including a plurality of stepped surface portions; and a first recess portion adjacent to the first protrusion portion, a distance along a first direction from an uppermost portion of the first recess portion to a bottom portion of the first recess portion being greater than a height difference along the first direction between any stepped surface portions of the stepped region, a width along a second direction perpendicular to the first direction between sidewalls of the first recess portion being greater than a width of any stepped surface portion of the stepped region in the second direction, wherein sidewalls of the first recess portion include a plurality of steps, and a width of each step in the plurality of steps in the second direction is less than a step width of any stepped surface portion in the plurality of stepped portions.

7. The template according to claim 6, wherein the bottom portion of the first recess portion includes a curved surface portion.

8. The template according to claim 7, wherein sidewalls of the first recess portion include a flat portion having a length in the first direction equal to a height difference along the first direction between any step surface portions of the stepped region.

9. The template according to claim 6, wherein
the first recess portion has an intermediate portion between the bottom portion and the first protrusion portion along the first surface in the second direction, and the intermediate portion has a depth in the first direction that is greater than a depth of the bottom portion in the first direction.

10. The template according to claim 9, wherein the intermediate portion completely surrounds the bottom portion in a plane parallel to a plane of the first surface.

11. The template according to claim 6, further comprising:
an outer edge region of the first surface surrounding the first protrusion portion and the first recess portion in a plane parallel to a plane of the first surface, depth of the outer edge region in the first direction being at least equal to a depth of the first recess portion in the first direction.

12. The template according to claim 6, wherein
the height difference between any stepped surface portions of the stepped region is in a range of 10 nm to 500 nm, and the width of any stepped surface portions in the second direction is in a range of 10 nm to 2000 nm.

13. A method of patterning a substrate, comprising:
imprinting a resin material using a template according to claim 6.

14. A template for imprint lithography, comprising:
a first protrusion portion on a first surface and having a stepped region including a plurality of stepped surface portions; and a first recess portion adjacent to the first protrusion portion, a distance along a first direction from an uppermost portion of the first recess portion to a bottom portion of the first recess portion being greater than a height difference along the first direction between any stepped surface portions of the stepped region, a width along a second direction perpendicular to the first direction between sidewalls of the first recess portion being greater than a width of any stepped surface portion of the stepped region in the second direction, wherein the first recess portion has an intermediate portion between the bottom portion and the first protrusion portion along the first surface in the second direction, and the intermediate portion has a depth in the first direction that is greater than a depth of the bottom portion in the first direction.

15. A method of patterning a substrate, comprising:
imprinting a resin material using a template according to claim 14.

16. The template according to claim 14, wherein
the height difference between any stepped surface portions of the stepped region is in a range of 10 nm to 500 nm, and the width of any stepped surface portions in the second direction is in a range of 10 nm to 2000 nm.

17. The template according to claim 14, further comprising:
an outer edge region of the first surface surrounding the first protrusion portion and the first recess portion in a plane parallel to a plane of the first surface, depth of the outer edge region in the first direction being at least equal to a depth of the first recess portion in the first direction.

18. The template according to claim 14, wherein the intermediate portion completely surrounds the bottom portion in a plane parallel to a plane of the first surface.

19. The template according to claim 14, wherein the bottom portion of the first recess portion includes a curved surface portion.

* * * * *